United States Patent [19]

Takinami et al.

[11] Patent Number: 5,227,667
[45] Date of Patent: Jul. 13, 1993

[54] MICROWAVE PROXIMITY SWITCH

[75] Inventors: Takaharu Takinami; Koichi Tsujino, both of Kyoto, Japan

[73] Assignee: Omron Corporation, Kyoto, Japan

[21] Appl. No.: 807,651

[22] Filed: Dec. 16, 1991

Related U.S. Application Data

[63] Continuation of Ser. No. 457,471, Dec. 28, 1989, abandoned.

[30] Foreign Application Priority Data

Jan. 10, 1989 [JP] Japan ................................. 1-1986
Jan. 10, 1989 [JP] Japan ................................. 1-1987

[51] Int. Cl.⁵ .......................... H01P 7/10; H03B 5/18
[52] U.S. Cl. .............................. 307/129; 324/207.26; 324/633; 324/655; 340/552; 340/553
[58] Field of Search ............... 324/633, 655, 207.16, 324/207.26, 236, 237; 331/65, 117 R; 361/179, 180; 307/116, 117, 129; 340/552, 553

[56] References Cited

U.S. PATENT DOCUMENTS

| | | | |
|---|---|---|---|
| 4,215,341 | 7/1980 | Cole | 340/552 |
| 4,553,040 | 11/1985 | Trüper et al. | 307/116 |
| 4,613,830 | 9/1986 | Kamiya et al. | 324/207.26 |
| 4,663,542 | 5/1987 | Buck et al. | 361/180 |
| 4,771,359 | 9/1988 | Link | 361/179 |
| 4,845,422 | 7/1989 | Damon | 324/644 |
| 4,968,953 | 11/1990 | Kanda et al. | 361/180 |

FOREIGN PATENT DOCUMENTS 55-162504 5/1980 Japan .
56-168405 12/1981 Japan .
62-259048 11/1987 Japan .

*Primary Examiner*—Jeffrey A. Gaffin
*Attorney, Agent, or Firm*—Fish & Richardson

[57] ABSTRACT

A microwave proximity detector includes a microwave oscillator circuit having a dielectric resonator, or having a micro strip line as an inductor thereof so as to sense a change in an oscillation frequency or output from the oscillator circuit caused by a variation in an impedance of a circuit including the dielectric resonator, or of the micro strip line, due to a loss which takes place in a leakage magnetic field from the micro strip line when an object approaches the leakage magnetic field, thereby detecting an object in the neighborhood of the switch.

6 Claims, 5 Drawing Sheets

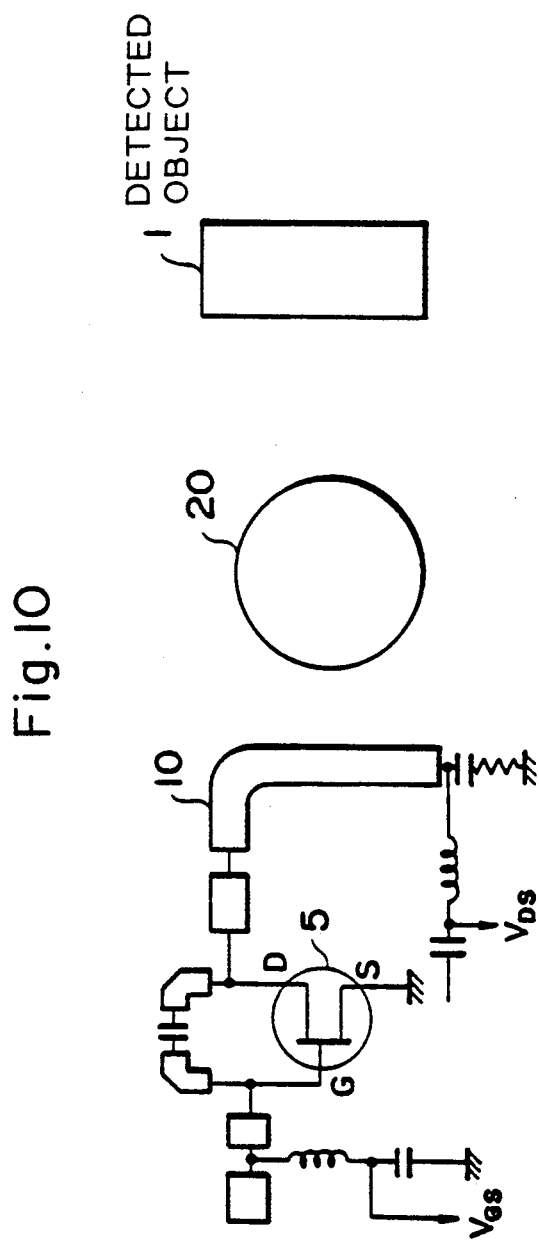

MICROWAVE PROXIMITY SWITCH

This application is a continuation of U.S. application Ser. No. 07/457,471, filed Dec. 28, 1989, now abandoned.

BACKGROUND OF THE INVENTION

1. Field of the Invention

The present invention relates to a microwave proximity detector for sensing whether or not an object which causes a loss in a leakage magnetic field from a circuit system having a microwave band oscillator circuit is present in the proximity thereof.

2. Description of the Prior Art

Conventionally, there have been adopted various kinds of proximity detectors or switches, which however are attended with disdavanitges as follows.

In a high frequency proximity switch, a sensing or sense distance in which the switch is effective is small, namely, is at most half the diameter of a sense coil used in the switch (e.g. for a coil having a diameter 12 millimeters, mm, the sense distance is two millimeters). In consequence, when the switch includes a sense coil having a small diameter, there may occur a case where an object to be sensed collides with a sensor head.

In an ultrasonic proximity switch, a reverberation of a mechanical vibration of an ultrasonic vibrator thereof makes it difficult to sense an object existing within a range of at most 5 centimeters, cm (to ten centimeters) from the proximity of the sensor. In production sites such as factories and firms, ultrasonic waves generated, for example, by a collision of work machinery may also cause a wrong operation.

In a photoelectric switch, owing to properties of lights, it is difficult to sense reflection lights from objects such as a transparent object like glass and an object having a matted black surface. Namely, such an object cannot be easily sensed. Furthermore, depending on a degree of dirtiness of a lens of the sensor, dirts or oils thereon, etc., characteristics of the sensor such as a sense distance are disadvantageously varied.

In the microwave proximity sensor of the prior art, since the sense operation is carried out based on a Doppler effect (of a differential output type), there arises a difficulty when a stationary object is to be sensed. Moreover, for sensors of which the intensity of electric field is at least 3.5 f ($\mu$ V/m), where the frequency is in the unit of gigahertz, GHz and the value is obtained at a distance of three meters from the sensors, an approval is necessary for each sensor in conformity with the Radio Law.

SUMMARY OF THE INVENTION

It is therefore an object the present invention to provide a microwave proximity detector which can continuously sense an object at a relatively short distance therefrom in a range beginning from a distance 0 mm, which is resistive against dirts and dusts, and which can also sense a stationary object.

A microwave proximity detector in accordance with a first invention is characterized by comprising a microwave oscillator circuit including a micro strip line as an inductor and sense means for sensing a change in an oscillation state of the microwave osillator circuit caused by a variation in an impedance of the micro strip line due to a loss of a leakage magnetic field from the micro strip line when an object approaches the leakage magnetic field.

The change in the oscillation state of the microwave osillator circuit includes an alteration in an oscillation frequency and a variation in an oscillation output from the microwave osillator circuit.

The micro strip line may be any transmission line applicable to a microwave oscillator circuit which causes a leakage magnetic field to be generated, for example, a slot line and a transmission line in a spiral shape may be adopted.

In the microwave proximity detector in accordance with the first embodiment, when a loss of the leakage magnetic field from the micro strip line is caused due to an object to be sensed approaching the detector (e.g. an eddy current loss or a skin effect loss in a case of a metal), there appears a change in the impedance of the micro strip line, which leads to a variation in the oscillation frequency or output of the oscillator circuit. Namely, an approach of an object can be detected by sensing the change in the oscillation frequency and/or output.

A microwave proximity detector in accordance with a second invention is characterized by comprising a microwave oscillator circuit having a dielectric resonator and sense means for sensing a change in an oscillation state of the microwave oscillator circuit caused by a variation in an impedance of the circuit including the dielectric resonator due to a loss of a leakage magnetic field from the dielectric resonator when an object approaches the leakage magnetic field.

The change above in the oscillation state of the microwave oscillator means includes an alteration in an oscillation frequency and a variation in an oscillation output from the microwave oscillator circuit.

In the microwave proximity detector in accordance with the second invention, a loss in the leakage magnetic field from the dielectric resonator due to an approach of an object to be sensed (e.g. an eddy current loss or a skin effect loss in a case of a metal) varies the impedance of the circuit including the dielectric resonator, thereby altering the oscillation frequency or output from the oscillator circuit. It is therefore possible to detect an object in the vicinity of the detector by sensing the change in the oscillation frequency or output.

Since the leakage magnetic field form the micro strip line or the dielectric resonator exponentially decreases or attenuates as the distance between the detector and the object is increased, when the distance is about several times the microwave frequency (i.e. about several tens of centimeters), the intensity of leakage magnetic field is sufficietly attenuated to a very low radio level. As a result, with respect to the utilization of the sensor, the detector is beyond the restricted range of the Radio Law. In consequence, the switch can be more conveniently handled by the user.

Furthermore, the loss of the leakage magnetic field from the micro strip line or the dielectric resonator also takes place when the object is relatively in a stationray state, which consequently enables the detector to sense a stationary object. Namely, there is attained a wider application range for the sensor.

It is natural that the detector is not associated with a dead zone as is the case in an ultrasonic switch and hence is applicable to a sense operation in a range beginning from the distance of 0 mm. Moreover, thanks to the property of the microwave, the detector is resistive against dusts and dirts. As compared with the high frequency proximity switch, the sense distance can be elongated by use of the detector in accordance with the present invention.

BRIEF DESCRIPTION OF THE DRAWINGS

These and other objects and advantages of the present invention will become apparent by reference to the following description and accompanying drawings wherein:

FIGS. 7 and 8 are schematic diagrams showing another example of the microwave transmission line in which FIG. 7 is a perspective view and FIG. 8 is a plan view only including the strip line;

FIG. 10 is a circuit diagram schematically showing an example of a microwave band oscillator circuit in a second embodiment in accordance with the present invention;

DESCRIPTION OF THE PREFERRED EMBODIMENTS

Figure 1:
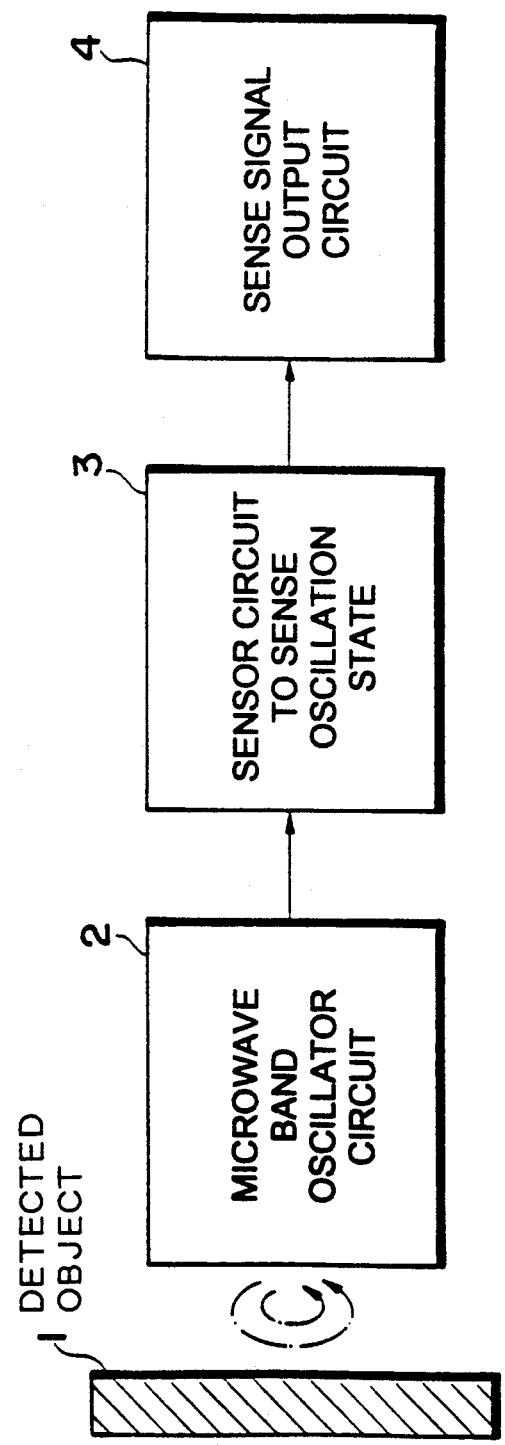
FIG. 1 is a schematic block diagram showing an electric constitution of a microwave proximity detector.

Referring now to the drawings, description will be given of an embodiment of the microwave proximity detector according to the present invention.

FIG. 1 is a block diagram showing the constitution of a microwave proximity detector.

The microwave proximity detector includes an oscillator circuit 2 to conduct an oscillation with a frequency (wavelength) in a microwave band, a sensor circuit 3 for sensing a change in the oscillation state (a change in the oscillation frequency or output) of the oscillator circuit 2 when an object 1 to be sensed approaches the vicinity of the oscillator circuit 2, and an output circuit 4 for converting a signal sensed by the sensor circuit 3 into an output signal in a predetermined format.

Figure 2:
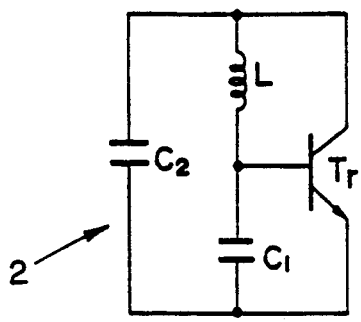
FIG. 2 is a diagram schematically showing a Colpitts oscillator circuit as an example of the microwave band oscillator circuit in a first embodiment in accordance with the present invention.
Figure 3:
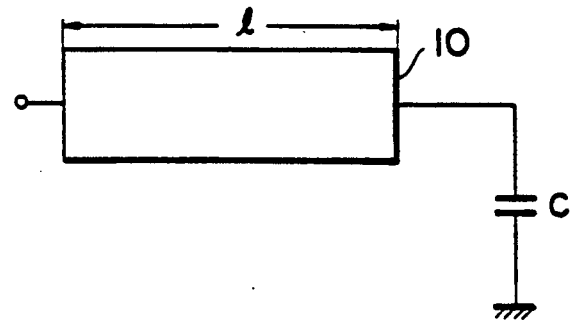
FIG. 3 is a schematic diagram showing a micro strip line terminated with a capacitor adopted as an inductor of the oscillator circuit above.
Figure 9:
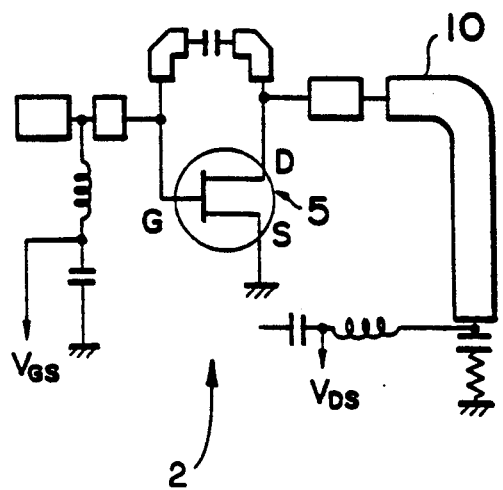
FIG. 9 is a schematic circuit diagram showing an example of an oscillation circuit.

FIG. 2 shows a Colpitts oscillator circuit as an example of the microwave band oscillator circuit 2. The Colpitts oscillator circuit is a well-known oscillator circuit comprising as a feedback circuit a resonance circuit including an inductor L and capacitors $C_1$ and $C_2$. There has been employed as the inductor of the Colpitts oscillator circuit, as shown in FIG. 3, a circuit structure in which a micro strip line 10 is terminated with a capacitor C. FIG. 9 shows an example of an oscillator circuit including the constitution above and a field-effect transistor, FET, 5.

Figure 5:
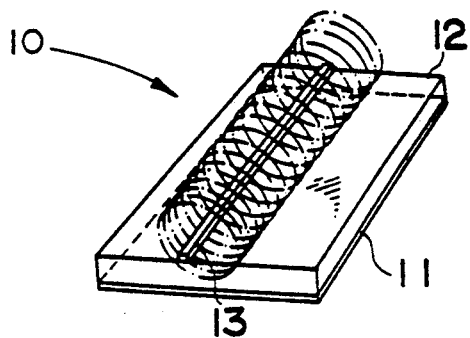
FIG. 5 is a perspective view illustratively showing a configuration of a micro strip line and a leakage magnetic field.
Figure 6:
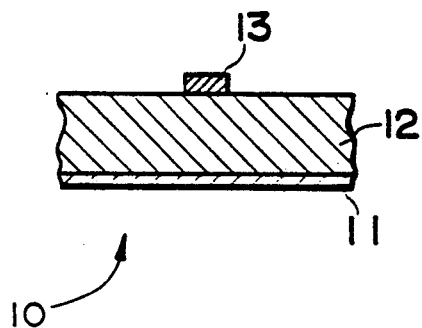
FIG. 6 is a cross-sectional view of the micro strip line.

FIG. 5 shows an example of the configuration of the micro strip line, whereas FIG. 6 is a cross-sectional view thereof. On a surface a dielectric substrate 12, there is formed a thin metal film 11. Disposed on another surface thereof is a strip line 13. In this configuration, a microwave propagates through the dielectric substrate 12 to generate a leakage magnetic field as indicated with dot-and-dash lines in FIG. 5.

In the micro strip line of this type, when the length thereof is at most $\lambda_g/4$ ($\lambda_g$ is a wavelength of the microwave in the dielectric material), the reactance of the line becomes to be inductive and can be hence used as an inductor. For example, under conditions of $\lambda_g/4 = 10$ mm and permittivity of dielectric substance $\epsilon_r = 10$, since $\lambda_g = \lambda_o/\sqrt{\epsilon_r}$, it is possible to propagate a microwave with a frequency $f_o = 3$ GHz. In consequence, the size of the sensor head can be considerably minimized.

Figure 4:
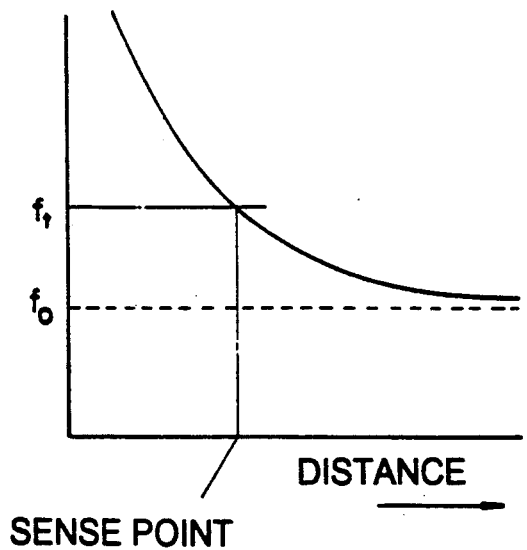
FIG. 4 is a graph showing a change in an oscillation frequency of the oscillator circuit with respect to the distance to an object to be sensed.

In a case where the object to be sensed 1 is found in the neighborhood of the leakage magnetic field produced from the micro strip line 10, a loss takes place in the magnetic field and hence the state of oscillation is altered in the oscillator circuit 2. For example, the oscillation frequency of the oscillator circuit 2 varies, as shown in the graph of FIG. 4, in association with the distance between the micro strip line 10 and the object 1. Consequently, in the sensor circuit 3, by achieving a frequency discrimination on the sensed frequencies depending on an appropriate threshold frequency $f_t$, there can be attained a sense signal designating the appearance of the object 1.

Figure 7:
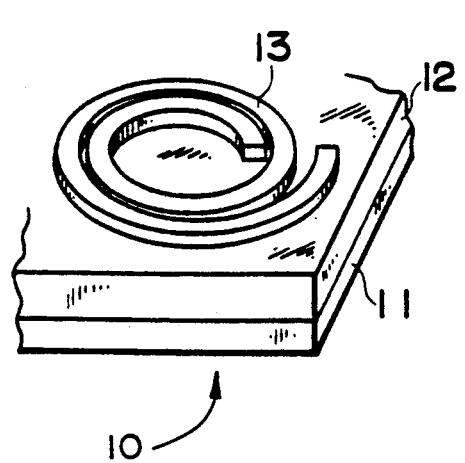
Figure 8:
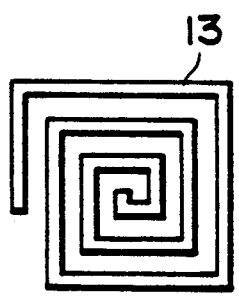

For the micro strip line 10, as can been seen from FIGS. 7 and 8, it is possible to use a spiral line formed in a circular or rectangular shape.

FIG. 10 shows another example of the configuration of the microwave band oscillator circuit 2. This configuration includes an FET 5 and a resonance circuit, which comprises a micro strip line 10 as an inductor thereof. The circuit associated with the FET 5 is inductively linked via the micro strip line 10 with a micro dielectric resonator 20. The micro strip line 10 is identical to that described above.

Figure 11:
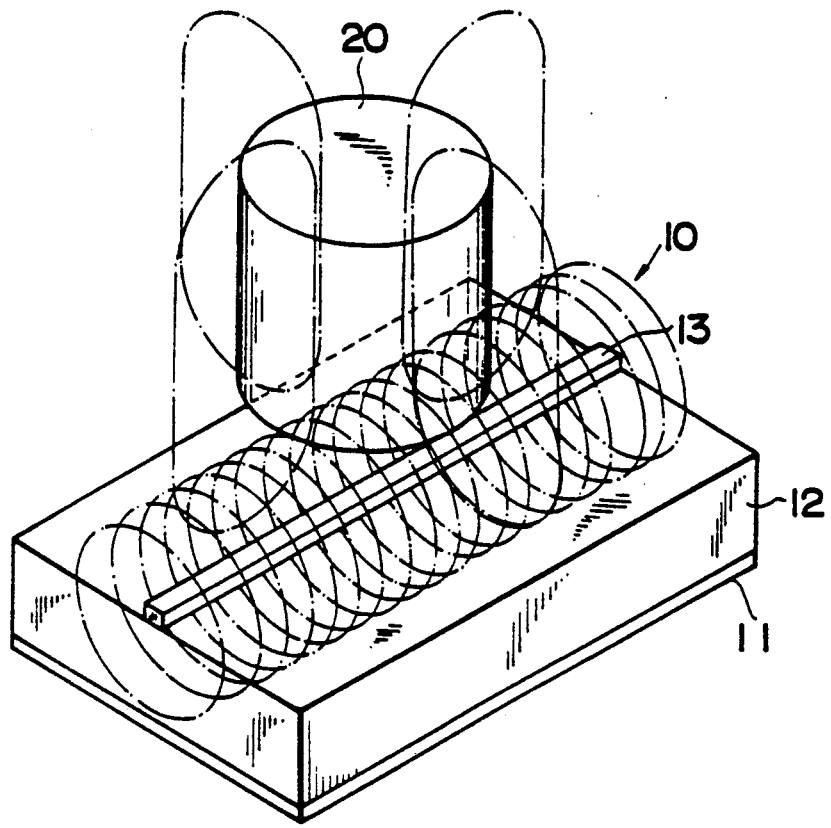
FIG. 11 is a perspective view showing a state in which a micro strip line is linked with a dielectric resonator.
Figure 12:
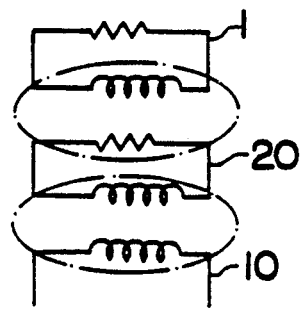
FIG. 12 is a diagram schematically showing an equivalent circuit of the configuration of FIG. 11.

FIG. 11 shows a state of coupling established between the micro strip line 10 and a micro dielectric resonator 20, whereas FIG. 12 shows an equivalent circuit of the configuration of FIG. 11. As described above, the microwave propagates through the dielectric substrate 12 to generate a leakage magnetic field as indicated with dot-and-dash lines. Namely, the leakage magnetic field from the micro strip line 10 is coupled with the dielectric resonator 20 such that a leakage magnetic field is generated from the dielectric resonator 20 in association with a resonance in the transverse electric resonant mode, TE mode. When an object to be sensed 1 exists in the proximity of the leakage magnetic field generated from the dielectric resonator 20, there occurs a loss in the magnetic field, which leads to a variation in the state of oscillation of the oscillator circuit 2. For example, the oscillation frequency of the oscillator circuit 2 changes, as shown in the graph of FIG. 4, depending on the distance between the dielectric resonator 20 and the object 1. In consequence, in the sensor circuit 3, by conducting a frequency discrimination on the obtained frequencies depending on an appropriate threshold frequency $f_t$, there can be obtained a sense signal denoting the existence of the object 1.

For the micro strip line 10, as described above, it is possible to use a spiral line formed in a circular or rectangular shape. Furthermore, the dielectric resonator of a cylindrical shape and the micro strip line may be configured in an arbitrary arrangement if there can be developed an induction coupling therebetween in the transverse electric resonant mode.

In the embodiment above, the object 1 is detected depending on a change in the oscillation frequency of the oscillator circuit 2. It is also possible to detect the object in a simplified construction where the oscillator circuit is designed with a negative conductance set to be as small as possible so as to sense an interruption of the oscillation. In more detail, when an object to be sensed enters a predetermined range of the sensor, the oscillator circuit interrupts its oscillation. This considerably alters the current consumption in the oscillator circuit. Namely, by sensing the change in the current, it is possible to sense an event that the object approaches the sensor.

Furthermore, the detector may be constituted such that a change in an impedance of the micro strip line terminated with a capacitor is sensed with a bridge circuit.

In the description above, although the Colpitts circuit is employed as an example of the oscillator circuit, there may be used a Hartley circuit including two inductors, a circuit utilizing three inductors, Clapp circuit and its variations, and any LC oscillator circuits suitable for the microwave band oscillation. In short, the detector can be implemented when the length of the inductor is $\lambda_g/4$ and the micro strip line is terminated with a capacitor of an appropriate capacitance.

While the particular embodiments of the invention have been shown and described, it will be obvious to those skilled in the art that various changes and modifications may be made without departing from the present invention in its broader aspects.

We claim:

1. A microwave proximity detector, comprising:
   a microwave oscillation circuit comprising an inductive element and a capacitive element tuned to resonate at a microwave frequency, said inductive element comprising a microstrip line terminated with a capacitor and which generates a leakage magnetic field;
   means for sensing a change in the microwave oscillation frequency of the microwave oscillation circuit when an object approaches the leakage magnetic field of the microstrip line; and
   output means for outputting a signal indicative of said change in frequency.

2. A microwave proximity detector as claimed in claim 1, wherein the change in oscillation frequency includes an interruption of oscillation of the microwave oscillation circuit.

3. A microwave proximity detector as claimed in claim 1, further comprising a dielectric resonator magnetically coupled with said microstrip line.

4. A microwave proximity detector as claimed in claim 3, wherein said dielectric resonator is mounted adjacent said microstrip line on a dielectric substrate.

5. A microwave proximity detector as claimed in claim 4, wherein the dielectric resonator generates a leakage magnetic field due to transverse mode resonance caused by the magnetic coupling with the microstrip line.

6. A microwave proximity detector as claimed in claim 1, wherein the microstrip line has a length less than one quarter of the wavelength of the microwave oscillation frequency of the microwave oscillation circuit when no object is present.

* * * * *